(12) United States Patent
Blakely (10) Patent No.: US 6,456,059 B1
(45) Date of Patent: Sep. 24, 2002

(54) NON-HOMOGENEOUS MATERIAL MAGNETIC FLUX SENSOR AND METHOD

(75) Inventor: John H. Blakely, Weaverville, NC (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/459,683

(22) Filed: Dec. 13, 1999

(51) Int. Cl.[7] ............................................. G01R 19/00
(52) U.S. Cl. ................. 324/127; 324/158.1; 324/117 H
(58) Field of Search ...................... 324/127, 117 H, 324/234–235, 151 A, 664, 247–249, 253, 158.1; 336/212

(56) References Cited

U.S. PATENT DOCUMENTS

| | | | | |
|---|---|---|---|---|
| 3,739,255 A | * | 6/1973 | Leppert ........................ | 336/212 |
| 4,056,770 A | * | 11/1977 | Mohr et al. ................... | 324/205 |
| 4,939,937 A | * | 7/1990 | Klauber et al. .............. | 324/209 |
| 4,979,399 A | * | 12/1990 | Klauber et al. .............. | 324/209 |
| 5,168,223 A | * | 12/1992 | Le Thiec ..................... | 324/253 |
| 5,581,224 A | * | 12/1996 | Yamaguchi .................. | 336/212 |
| 6,014,029 A | * | 1/2000 | Soto et al. ................... | 324/664 |

* cited by examiner

*Primary Examiner*—Michael Sherry
*Assistant Examiner*—Jimmy Nguyen
(74) *Attorney, Agent, or Firm*—David G. Luettgen; Alexander M. Gerasimow; William R. Walbrun (57) ABSTRACT

A sensor comprises a magnetic flux divider and a winding. The magnetic flux divider comprises first and second magnetic paths through which magnetic flux flows. The magnetic flux divider divides the magnetic flux between the first and second magnetic paths as a function of a total amount of magnetic flux flowing through the magnetic flux divider. The winding produces a signal that is indicative of the total amount of magnetic flux flowing through the flux divider based on the operation of the flux divider. A method of sensing a parameter comprises providing a material with a permeability that varies in accordance with an amount of magnetic flux passing through the material; and acquiring information indicative of the permeability of the material, the permeability of the material being indicative of the parameter. The sensor and method can be utilized to acquire information pertinent to another parameter of ultimate interest, such as information pertaining to a current flow in an electrical circuit.

34 Claims, 8 Drawing Sheets

NON-HOMOGENEOUS MATERIAL MAGNETIC FLUX SENSOR AND METHOD

BACKGROUND OF THE INVENTION

1. Field of the Invention

This invention relates to magnetic flux sensors and methods. In particular, this invention relates to a magnetic flux sensor that senses magnetic flux by determining information pertaining to a flux-dependent parameter of a material through which the magnetic flux passes. In a particularly preferred embodiment, this invention relates to a magnetic flux sensor that utilizes flux-dependent characteristics of two or more non-homogeneous materials to acquire information indicative of the magnetic flux. This invention also relates to sensor methods and systems that utilize magnetic flux sensors to acquire information pertinent to another ultimate parameter of interest, such as current.

2. Description of Related Art

Devices that in some way utilize magnetic flux are common and have been employed in a diverse array of applications. For example, magnetic devices such as transformers are commonly used by utilities and in various household and industrial applications to convert power sources from one voltage level to another voltage level. Another type of transformer is a current transformer, which is a widely employed device for performing current measurements. Magnetic devices also include electromechanical devices such as relays, electromagnetic contactors, electric motors, and electric generators. Relays and electromagnetic contactors are used to control whether a particular electrical connection is opened or closed. Electric motors and electric generators are used to convert electrical power into mechanical power and vice versa. Numerous other magnetic devices also exist.

A common problem with magnetic devices is that there is often no practical way of knowing how much magnetic flux is present in the device. This parameter is of obvious interest in any magnetics application, but is of particular interest in applications where the magnetic material that carries the magnetic flux is liable to become saturated.

Current transformers provide an especially good example of the problem. A current transformer comprises primary and secondary windings that are wound about a transformer core. A primary current $I_1$ flows through the primary winding and induces a magnetic flux which flows through the transformer core. The magnetic flux in turn induces a secondary current $I_2$ in the secondary winding. For a linear (unsaturated) current transformer, the primary current $I_1$ is related to the secondary current $I_2$ by the following relationship:

$$I_1 N_1 = I_2 N_2 \qquad (1)$$

Therefore, since the parameters $N_1$ and $N_2$ are known ($N_1$ and $N_2$ are the number of turns of the primary and secondary windings, respectively), the primary current $I_1$ may be measured indirectly by measuring the secondary current $I_2$. The secondary current $I_2$ may be measured by placing a burden resistor across the secondary winding, and measuring a voltage $V_2$ developed across the burden resistor as a result of the secondary current $I_2$:

$$I_1 = \frac{V_2}{R_b}\left(\frac{N_2}{N_1}\right) \qquad (2)$$

where $R_b$ is the resistance of the burden resistor. In short, therefore, the primary current $I_1$ may be determined by measuring the voltage $V_2$.

The voltage $V_2$ that is developed across the secondary winding is related to the net magnetic flux $\Phi$ in the following manner:

$$V_2 = N_2 \frac{d\Phi}{dt} \qquad (3)$$

(Although Eq. (3) is sometimes written with a minus sign before the right-hand term, a minus sign is not used herein.) In saturation, since the net magnetic flux $\Phi$ stays at a constant saturated level, there are no time varying changes in the net magnetic flux $\Phi$. As a result, there is no voltage developed across the secondary winding ($V_2$=0) and there is no secondary current that flows through the secondary winding ($I_2$=0). This is true even though current continues to flow in the primary winding ($I_1 \neq 0$). It is therefore apparent that, in saturation, Eqs. (1) and (2) do not apply and the primary current $I_1$ cannot be measured.

Typically, saturation can be avoided by only measuring currents above a certain frequency and below a certain magnitude, these operational limits being determined by the construction of the current transformer. However, sometimes low frequency components appear unexpectedly in the primary current, causing the current transformer to go into saturation. Therefore, knowing the amount of magnetic flux in the transformer core would be highly advantageous, because it would provide an opportunity to take measures to counteract the low frequency components that would otherwise cause the transformer core to saturate. Indeed, it would be even more advantageous if those low frequency could not only be counteracted, but measured as well.

This same general phenomenon also exists with respect to other magnetic devices. For example, synchronous electric motors operate through the creation of a magnetic field that rotates in synchronism with the rotor. The rotating magnetic field is generated by providing the stator with sinusoidal drive current. However, given that the drive current is often electronically-generated, it is possible that DC and/or other low frequency current components can "creep into" into the drive current, causing the magnetic material in the motor to tend toward saturation. Such current components can occur, for example, if the switching transistors used to generate the sinusoidal excitation current are not perfectly matched. Magnetic losses in motors often help avoid saturation, but low frequency current components nevertheless at least cause the motor to operate less efficiently.

Even ignoring the problem of saturation and low frequency current components, it is often desirable for other reasons to monitor the magnetic flux in a magnetic device. The provision of a rotating magnetic field is a fundamental aspect motor control. Typically, however, the magnetic flux in the motor is not directly measured but rather is assumed to have a certain value (or distribution of values) based on the known current that is applied to the motor. Being able to directly measure the magnetic flux in an electric motor would provide an opportunity for better, more efficient control of the motor.

Likewise, for electromagnetic contactors, or for other devices in which an electromagnetic field provides an actuating force for moving a mechanical substructure, a direct measure of the magnetic flux would allow the actuating motion to be controlled more precisely. This could be used to improve operation of the device or to effect other desirable results, such as extending the life of the device.

Magnetic flux sensors have previously been provided. For example, current transformers are one type of magnetic flux sensor, i.e., because a current transformer operates by having a secondary winding that senses magnetic flux in the core of the transformer. Conventional current transformers, however, are not well-suited to measuring low frequency flux components for the reasons previously described.

Another type of magnetic flux sensor is the Hall-effect sensor. When a conductor carrying a current is placed in a magnetic field, a voltage is created across the conductor in a direction that is perpendicular to both the direction of the magnetic field and the direction of current flow. This well known phenomenon is referred to as the "Hall-effect," and is the operating principle for Hall-effect sensors. Magnetic flux sensors that operate based on the Hall-effect have been employed in a diverse array of applications, such as current sensors.

A primary disadvantage of Hall-effect sensors, however, is that they must be placed in the magnetic path, which usually requires that a gap be made in the flux-carrying material. Given the extremely low permeability of air (approximately 1.0) as compared to most core materials (in the range of $10^4$ to $10^5$ depending on the material used and operating conditions), the insertion of an air gap, however small, has a dramatic and usually undesirable effect on the magnetic characteristics of the system. For example, conventional current sensors that use Hall-effect devices have significantly poorer resolution and accuracy than current transformers over those operating ranges in which current transformers do not saturate.

Therefore, what is needed is an improved method and system for magnetic flux sensing. What is also needed is an improved method and system for flux sensing that is capable of operating in the presence of low frequency flux components, and even more preferably capable of measuring those low frequency flux components.

BRIEF SUMMARY OF THE INVENTION

The present invention overcomes these drawbacks of the prior art. In particular, in accordance with a first aspect of the invention, the invention provides a method of sensing a parameter comprising providing a material with a permeability that varies in accordance with an amount of magnetic flux passing through the material; and acquiring information indicative of the permeability of the material, the permeability of the material being indicative of the parameter.

According to a second aspect of the invention, the invention provides a method of sensing a parameter comprising providing a first material that is characterized by a first permeability function and providing a second material that is characterized by a second permeability function. The second permeability function is different than the first permeability function. The method then also comprises acquiring information indicative of permeability of the first material relative to the second material. The permeability of the first material relative to the second material is indicative of the parameter. The first permeability function may, for example, vary with respect to the second permeability function by an amount that is dependent on the amount of magnetic flux carried by the first and second materials.

Preferably, the acquiring step comprises applying an excitation signal to an excitation winding, the excitation winding being wound around the second material; and measuring a sense signal produced at a sense winding. The sense winding is wound around the second material. The sense signal is produced in response to the excitation signal, and the sense signal has a characteristic that is indicative of the permeability of the first material relative to the second material.

According to a third aspect of the invention, the invention provides a sensor comprising a magnetic flux divider and a winding. The magnetic flux divider comprises first and second magnetic paths through which magnetic flux flows. The magnetic flux divider divides the magnetic flux between the first and second magnetic paths as a function of a total amount of magnetic flux flowing through the magnetic flux divider. The winding produces a signal that is indicative of the total amount of magnetic flux flowing through the flux divider based on the operation of the flux divider.

According to a fourth aspect of the invention, the invention provides a sensor comprising first and second structures formed of first and second magnetically conductive materials, an excitation winding, an excitation source, and a sense winding. The first material has a first permeability that varies in accordance with an amount of magnetic flux passing through the first material, and the second material has a second permeability that varies in accordance with an amount of magnetic flux passing through the second material. The excitation winding is wound around the second structure, and the excitation source applies an excitation signal to the excitation winding. The sense winding is wound around the second material, and produces a sense signal in response to the excitation signal applied to the excitation winding. The sense signal is indicative of the permeability of the first material relative to the permeability of the second material.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1:
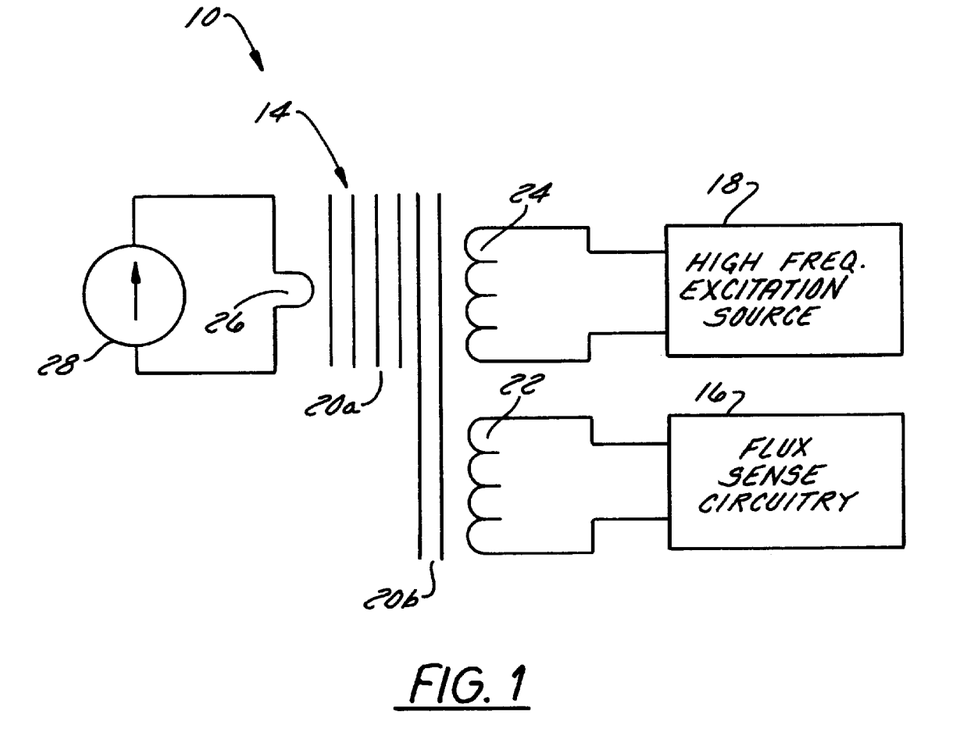
FIG. 1 is a flux sensor in accordance with a first preferred embodiment of the invention.

Referring first to FIG. 1, a flux sensing system 10 in accordance with a first preferred embodiment of the invention is illustrated. By way of overview, the system 10 includes a transformer 14, flux sense circuitry 16, and a high frequency excitation source 18. The transformer 14 comprises first and second transformer cores 20a and 20b, a sense winding 22 which is associated with the flux sense circuitry 16, and an excitation winding 24 which is associated with the high frequency excitation source 18. The system 10 is used to measure flux in the transformer cores 20a and 20b. In FIG. 1, the flux is induced by current flow in a winding 26 coupled to a current source 28. Of course, the flux could be developed in the transformer cores 20a and 20b by some other mechanism. Additionally, while the magnetic device is shown in FIG. 1 to be a transformer, the invention is equally applicable to other types of magnetic devices.

Figure 2A:
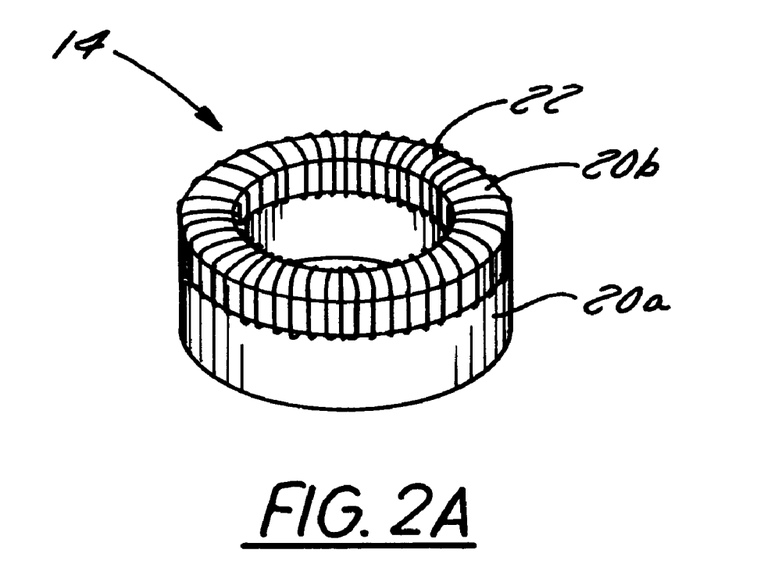
FIGS. 2A and 2B show the construction of a transformer for the flux sensor of FIG. 1.
Figure 2B:
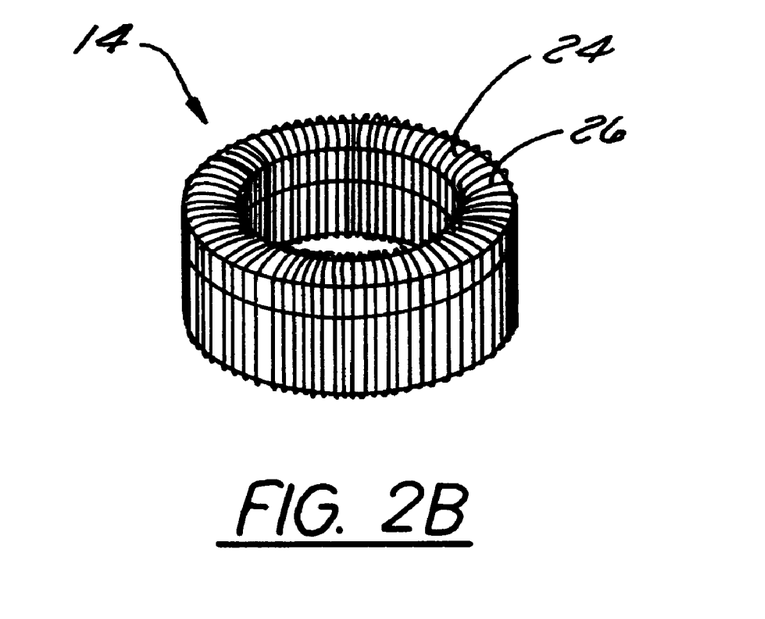

FIGS. 2A and 2B show the construction of the transformer 14 in greater detail. As previously noted, the transformer 14 is constructed of first and second transformer cores 20a and 20b. In order to facilitate construction, the transformer cores 20a and 20b preferably have the same mean path length ($L_{e1}=L_{e2}$), although transformer cores with different mean path lengths could also be used. To fabricate the transformer 14, the transformer core 20b is first wound with the sense winding 22. Then, the transformer core 20b and sense winding 22 are placed adjacent the transformer core 20a (FIG. 2A), and the combination of these structures is wound with the excitation winding 24 and the primary winding 26 (FIG. 2B). The sense winding 22 is therefore wound only around the transformer core 20b, and not the transformer core 20a, and the excitation winding 24 and the primary winding 26 are wound around both the transformer core 20 and the transformer core 20b. This is shown schematically in FIG. 1 by virtue of the core 20a being shown not to extend adjacent the winding 22. The sense winding 22 and the excitation winding 24 may each, for example, comprise between 100 and 10,000 turns, although other number of turns could also be used. The primary winding may comprise a smaller number of turns, for example, one turn.

The transformer cores 20a and 20b are constructed of materials with different magnetic characteristics. Currently, the preferred material for the transformer core 20a (or analogous component in most other flux sensing applications) is Supermalloy provided in the form of a tape wound core. This material can be purchased as Part # 343 P 4902 from Magnetic Metals Corporation, 2475 LaPalma Avenue, Anaheim, Calif., 92801. For flux sensing applications in which the ultimate parameter of interest is current, the currently preferred material for the core 14a is Supermalloy, Part # 343 P 8602, available from the same company. The preferred material for the transformer core 20b is Permalloy 80 provided in the form of a stamped lamination. This material can be purchased as Part # R-510-14D from Magnetics Inc., 796 East Butler Road P.O. Box 391 Butler, Pa. 16003.

Figure 3:
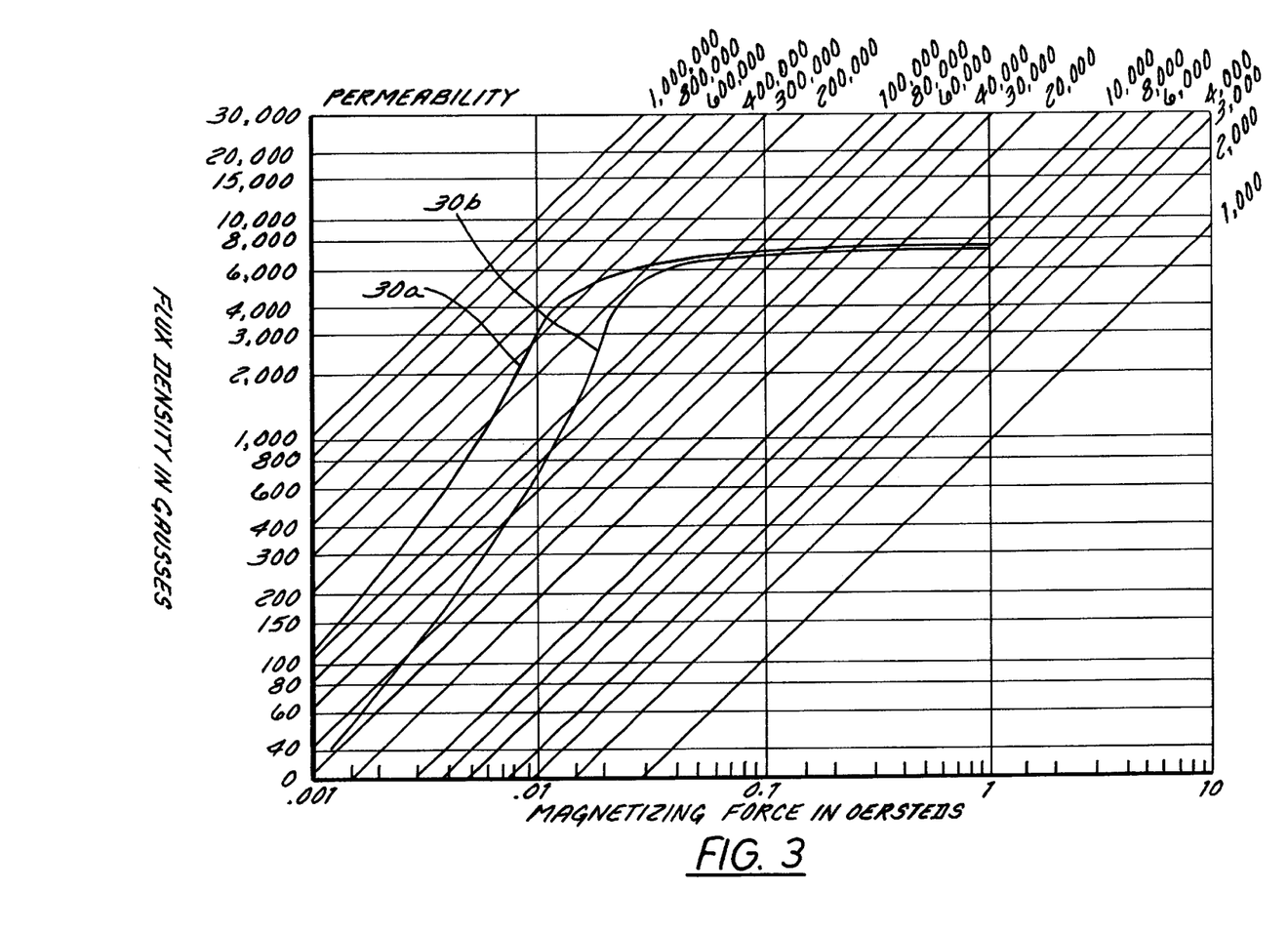
FIG. 3 is a graph of the permeability of two materials used to construct the transformer of FIGS. 2A and 2B.

FIG. 3 shows permeability functions 30a and 30b for Supermalloy and Permalloy 80, respectively. The permeability functions are both a function of flux density, but the permeability functions vary with respect to each other in a way that is not divisible by a single scalar constant. Thus, although both functions vary with respect to flux density, they also vary with respect to each other in a manner that varies in accordance with flux density. Since magnetic flux density is related to magnetic flux and magnetic field intensity, the permeabilities of the transformer cores 20a and 20b also vary with respect to each other as a function of these parameters as well.

Figure 4:
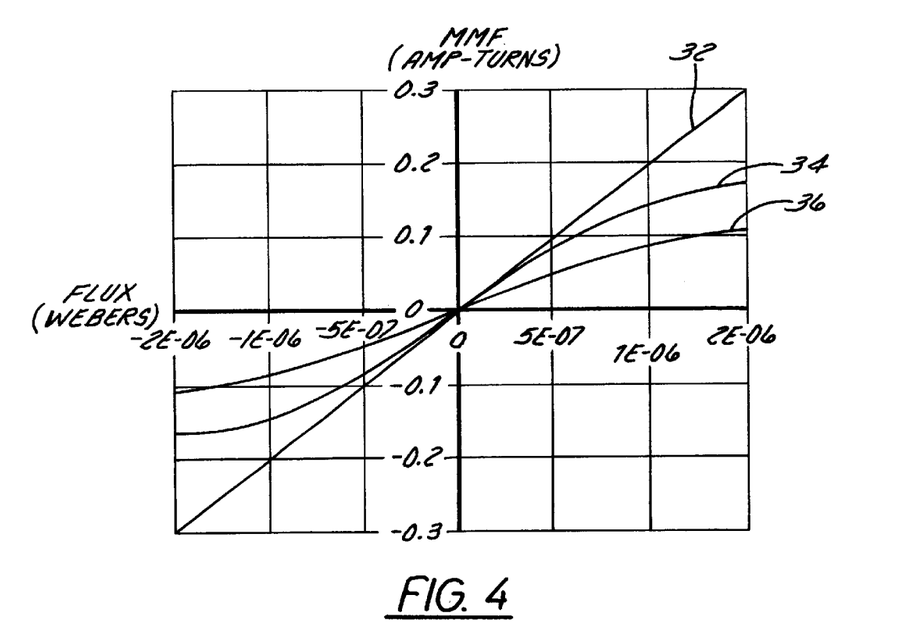
FIG. 4 is a graph showing the reluctance of two materials for a transformer of the type shown in FIGS. 2A and 2B.

FIG. 4 shows this effect more dramatically. FIG. 4 is a graph of the reluctance of the transformer core 20a (curve 32) with respect to magnetic flux, the reluctance of the transformer core 20b (curve 34) with respect to magnetic flux, and the total reluctance of the transformer 14 (curve 36) with respect to magnetic flux. The magnetic properties shown in FIG. 4 have been exaggerated somewhat for purposes of explanation. The curves 32, 34 and 36 do not accurately describe the preferred Permalloy and Supermalloy 80 materials.

The transformer cores 20a and 20b serve as a flux divider and carry varying proportions of magnetic flux in accordance with the total amount of flux flowing through the transformer 14. In particular, reluctance is equal to the mean path length $L_e$ divided by the product of the effective area $A_e$ and the permeability $$\left(R = \frac{L_e}{A_e \mu_r \mu_0}\right).$$

It is therefore seen that, in operation, as the proportion of $\mu_1$ to $\mu_2$ varies, the proportion of the magnetic flux that flows in the transformer core 20a relative to the proportion that flows in the transformer core 20b will also vary. For example, if $$\frac{\mu_1}{\mu_2}$$

is decreasing and therefore $$\frac{R_1}{R_2}$$

is increasing as flux increases (although the opposite approach could also be used), then the reluctance $R_2$ for the transformer core 20b will be decreasing relative to the reluctance $R_1$ for the transformer core 20a, and a greater proportion of the flux will flow in the transformer core 20b than in the transformer core 20a. As described in greater detail below, the excitation signal applied to the excitation winding 24 causes high frequency flux excursions that are experienced by both the transformer core 20a and the transformer core 20b. However, the decreasing reluctance of the transformer core 20b relative to the reluctance of the transformer core 20a causes the portion of the flux excursion experienced by the transformer core 20b to increase. In turn, this causes the peak-to-peak voltage of the signal appearing at the sense winding 22 to experience a corresponding increase. The voltage across the sense winding 22 can therefore be monitored to obtain an indication of Since $$\frac{\mu_1}{\mu_2}$$

is a function of the amount of flux in the transformer cores 20a and 20b, obtaining an indication of $$\frac{\mu_1}{\mu_2}$$

also means that an indication of the flux in the transformer cores 20a and 20b is obtained.

Referring back to FIG. 1, in practice, the flux sense circuitry 16 preferably comprises a high impedance voltage sensing circuit. A high impedance circuit is preferred so that practically no current is induced in the sense circuitry 16 during operation of the system 10. In practice, the flux sense circuitry 16 could be simply an operation amplifier connected to sense the voltage across the sense winding 22. In a more elaborate embodiment, the flux sense circuitry could be an A/D converter connected to digitize the voltage across the sense winding 22. As will become apparent below, the voltage across the sense winding 22 is indicative of the magnetic flux density in the cores 20a and 20b. However, because this relationship is not linear, it may also be desirable to linearize the output of the flux sense circuitry. In this event, the output of the A/D converter may be processed by a microprocessor that has access to a look-up table to perform such a linearization. Additionally, if it is desired to know an actual value of the magnetic flux density, rather than just whether the flux is increasing or decreasing or staying constant, then the flux sense circuitry may also comprise a microprocessor that has access to a look-up table to convert the sensed voltage into a flux density value. The manner in which the sensed voltage can be converted to a flux density is described in greater detail below.

The high frequency excitation source 18 supplies a high frequency excitation signal to the excitation winding 24. The frequency of the excitation signal is high relative to the frequency of the current in the primary winding 26, in order to permit the portion of the voltage appearing at the sense winding 22 attributable to the excitation applied at the excitation winding 24 to be distinguishable from the portion attributable to the excitation (i.e., the primary current) applied at the primary winding 26. Currently, the preferred excitation signal is a 20 kHz square wave voltage excitation signal. However, the optimal frequency of the source 18 may be different on the anticipated frequency of the current source 26, and depending on the technique used to detect the polarity of the magnetic flux, as described below. Additionally, although the mathematical description given below assumes a square wave voltage excitation signal, other types of signals could also be used.

The operation of the system 10 will now be described. The mathematical derivation that follows is given for purposes of explaining why the voltage across the sense winding 22 is indicative of the magnetic flux, magnetic flux density and magnetic field intensity in the transformer cores 20a and 20b. As will become apparent, it is not necessary that any of the following equations be calculated during the operation of the flux sensing system 10.

In operation, a primary current is applied at the primary winding 26. The primary current is assumed to be a low frequency current. The 20 kHz square wave voltage excitation applied at the excitation winding 24 also causes an additional current to flow in the excitation winding 24. Approximately no current flows in the sense winding 22 given the high impedance input characteristics of the flux sense circuitry 16. The currents in the windings 24 and 26 combine to induce a magnetic flux $\Phi$ in the current transformer 14 that is the sum of the magnetic flux $\Phi_1$ in the transformer core 20a and the magnetic flux $\Phi_2$ n the transformer core 20b:

$$\Phi = \Phi_1 + \Phi_2 \tag{4}$$

In general, magnetic flux is equal to magnetic flux density integrated over the area through which the flux passes. Therefore, assuming an equal magnetic flux density $B_1$ throughout the transformer core 20a, then the magnetic flux $\Phi_1$ is equal to the magnetic flux density $B_1$ multiplied by the effective area $A_{e1}$ of the transformer core 20a:

$$\Phi_1 = B_1 \cdot A_{e1} \tag{5}$$

Likewise, assuming an equal magnetic flux density $B_2$ throughout the transformer core 20b, then the magnetic flux $\Phi_2$ is equal to the magnetic flux density $B_2$ multiplied by the effective area $A_{e2}$ of the transformer core 20b:

$$\Phi_2 = B_2 \cdot A_{e2} \tag{6}$$

In general, the voltage across a winding that is wound around a core is equal to the change in magnetic flux in the core with respect to time. The excitation winding 24 is wound around both transformer cores 20a and 20b, and the voltage $V_{exc}$ across the excitation winding is dependent on the total change in magnetic flux in the core with respect to time:

$$V_{exc} = N_{exc}\frac{d\Phi}{dt} = N_{exc}\left(\frac{d\Phi_1}{dt} + \frac{d\Phi_2}{dt}\right) \tag{7}$$

where $N_{exc}$ is the number of turns of the excitation winding 24. Substituting Eqs. (5) and (6) into Eq. (7) yields the following relationship:

$$V_{exc} = N_{exc}\left(A_{e1} \cdot \frac{dB_1}{dt} + A_{e2} \cdot \frac{dB_2}{dt}\right) \tag{8}$$

As previously noted, the excitation signal applied to the excitation winding 24 is preferably a 20 kHz square or pulse width modulated voltage signal. For a square wave excitation, the change in magnetic flux density is constant with respect to time (that is, the second derivative of the magnetic flux density is equal to zero). Therefore, the derivative $$\frac{dB_1}{dt}, \frac{dB_2}{dt}$$

of the magnetic flux density is equal to the total change in magnetic flux density $\Delta B_1$, $\Delta B_2$ divided by the time interval $\Delta t$ during which the change occurs:

$$\frac{dB_1}{dt} = \frac{\Delta B_1}{\Delta t} \quad (9a)$$

$$\frac{dB_2}{dt} = \frac{\Delta B_2}{\Delta t} \quad (9b)$$

Substituting Eqs. (9a) and (9b) into Eq. (8) yields the following relationship:

$$V_{exc} = N_{exc}\left(A_{e1} \cdot \frac{\Delta B_1}{\Delta t} + A_{e2} \cdot \frac{\Delta B_2}{\Delta t}\right) \quad (10)$$

In general, magnetic flux density is equal to magnetic field intensity multiplied by the permeability of the material. Thus, for the transformer cores 20a and 20b, the magnetic flux densities $B_1$ and $B_2$ can be rewritten as follows:

$$B_1 = \mu_1 \cdot H_1 \quad (11a)$$

$$B_2 = \mu_2 \cdot H_2 \quad (11b)$$

Substituting Eqs. (11a) and (11b) into Eq. (10) yields the following relationship:

$$V_{exc} = N_{exc}\left(A_{e1} \frac{\mu_1 \cdot \Delta H_1}{\Delta t} + A_{e2} \frac{\mu_2 \cdot \Delta H_2}{\Delta t}\right) \quad (12)$$

Since the excitation winding 24 is wound around both cores 20a and 20b, the change in magnetic field intensity caused by the excitation signal applied to the excitation winding 24 is the same for both the transformer cores 20a and 20b:

$$\Delta H_1 = \Delta H_2 \quad (13)$$

Previously, it was assumed that the mean path length of the transformer core 20a is equal to the mean path length of the transformer core 20b (Le1=Le2), this arrangement being preferred in order to simplify construction of the transformer 14. If this arrangement is not utilized, then Eq. (13) would also be a function of the ratios of the path lengths $$\left(\frac{L_{e1}}{L_{e2}}\right).$$

Substituting Eq. (13) into Eq. (12) and simplifying yields the following relationship:

$$V_{exc} = N_{exc} \frac{\Delta H}{\Delta t}(A_{e1} \cdot \mu_1 + A_{e2} \cdot \mu_2) \quad (14)$$

where $\Delta H = \Delta H_1 = \Delta H_2$.

The voltage $V_{sen}$ across the sense winding 22 can be derived in the same manner as the voltage $V_{exc}$ across the excitation winding 24, except that the change in the magnetic flux $$\frac{d\Phi_1}{dt}$$

in the transformer core 20a does not contribute to the voltage $V_{sen}$ across the sense winding 22 because the sense winding 22 is not wound around the transformer core 20a. Thus, the voltage $V_{sen}$ across the sense winding 22 can be expressed as follows:

$$V_{sen} = N_{sen} \frac{\Delta H}{\Delta t}(A_{e2} \cdot \mu_2) \quad (15)$$

wherein $N_{sen}$ is the number of turns of the sense winding 22. Dividing the voltage $V_{exc}$ across the excitation winding 24 (Eq. 14) by the voltage $V_{sen}$ across the sense winding 22 (Eq. 15) yields the following relationship:

$$\frac{V_{exc}}{V_{sen}} = \frac{N_{exc} \frac{\Delta H}{\Delta t}(A_{e1} \cdot \mu_1 + A_{e2} \cdot \mu_2)}{N_{sen} \frac{\Delta H}{\Delta t}(A_{e2} \cdot \mu_2)} \quad (16)$$

Canceling and rearranging terms in Eq. (16) yields the following relationship:

$$\frac{V_{exc}}{V_{sen}} = \frac{N_{exc}}{N_{sen}}\left(\frac{A_{e1} \cdot \mu_1}{A_{e2} \cdot \mu_2} + 1\right) \quad (17)$$

From Eq. (17), it is seen that the ratio $$\frac{V_{exc}}{V_{sen}}$$

is a function of the parameters $N_{exec}$, $N_{sen}$, $A_{e1}$, $A_{e2}$, and the ratio $$\frac{\mu_1}{\mu_2}.$$

However, the parameters $N_{exc}$, $N_{sen}$, $A_{e1}$, and $A_{e2}$ are constants that relate to the known construction of the current transformer. Further, the voltage $V_{exc}$ is the amplitude of the 20 kHz square wave excitation and is therefore also known, and the voltage $V_{sen}$ is measured using the flux sense circuitry 16 (which, as previously noted, comprises a voltage sensing circuit). Therefore, the voltage $V_{sen}$ is a function of only the ratio $$\frac{\mu_1}{\mu_2}.$$

As previously noted, the materials for the transformer cores 20a and 20b are chosen such that the materials have permeabilities both have permeability functions that are a function of flux density, but the permeability functions vary with respect to each other in a way that is not divisible by a single scalar constant. Although both functions vary with respect to flux density, they also vary with respect to each other in a manner that varies in accordance with flux density. Thus, since the ratio $$\frac{\mu_1}{\mu_2}$$

is a function of flux density, flux density can be sensed by sensing the voltage $V_{sen}$ across the sense winding 22.

Figure 5:
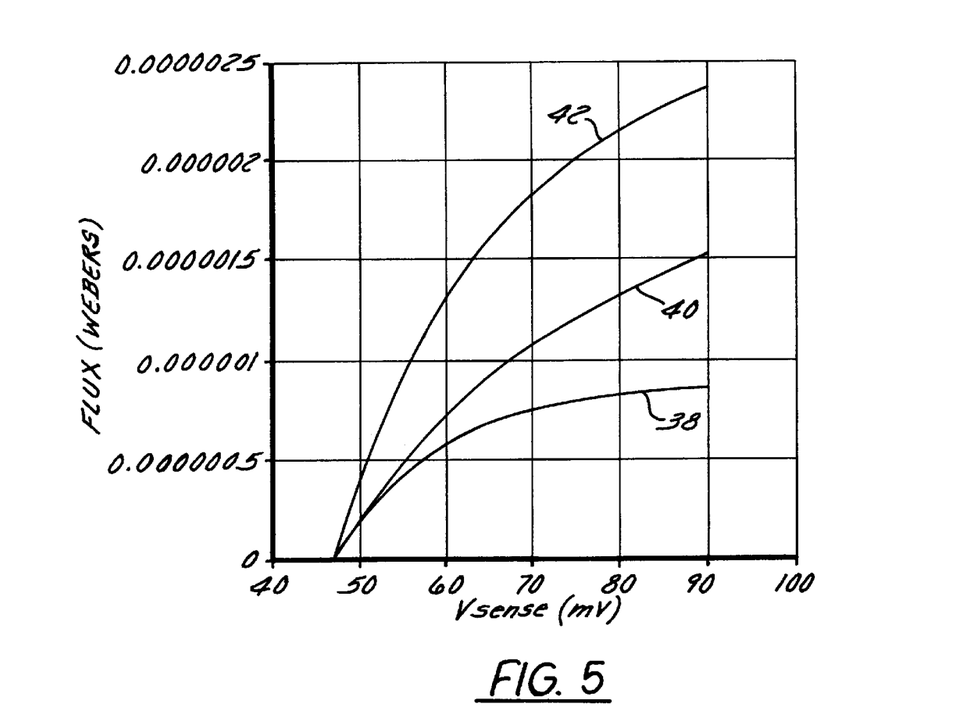
FIG. 5 is a graph of magnetic flux for two core materials, as well as a total magnetic flux, as a function of a voltage sensed across a sense winding in the system of FIG. 1.
Figure 6:
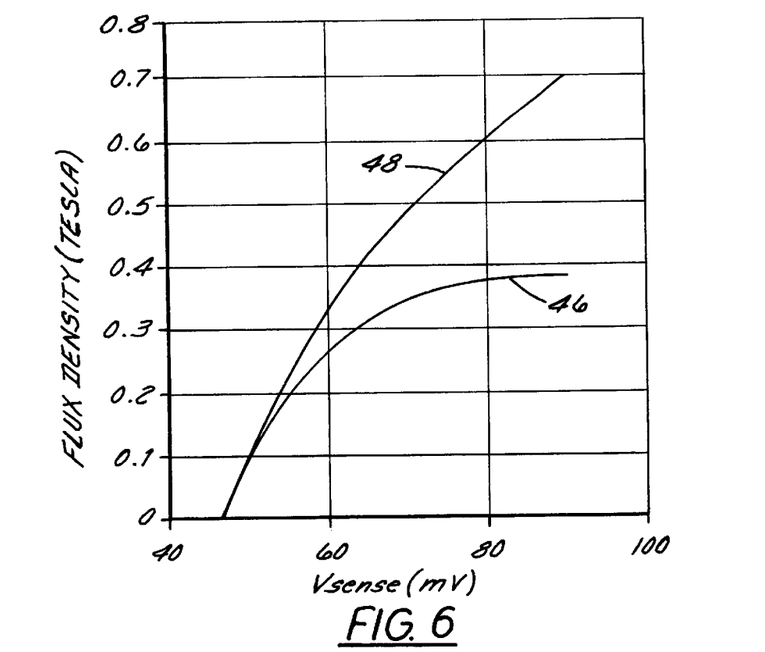
FIG. 6 is a graph of magnetic flux density for two core materials as a function of a voltage sensed across a sense winding in the system of FIG. 1.

Referring now to FIG. 5, FIG. 5 is a graph of the magnetic flux in the transformer core 20a as a function of the voltage $V_{sen}$ (curve 38), the magnetic flux in the transformer core 20b as a function of the voltage $V_{sen}$ (curve 40), and the total magnetic flux in the both the transformer cores 20a and 20b as a function of the voltage $V_{sen}$ (curve 42). FIG. 6 is similar, but has magnetic flux density instead of magnetic flux on the Y-axis. Thus, curve 46 is the variation in the magnetic flux density in transformer core 20a as a function of the voltage $V_{sen}$, and curve 48 is the variation in the magnetic flux density in transformer core 20b as a function of the voltage $V_{sen}$. It is therefore seen that, by storing the information represented in FIG. 5 or FIG. 6 in a look-up table, and accessing the look-up table using the voltage $V_{sen}$ as an input value, the voltage $V_{sen}$ can be converted into a flux or flux density value, respectively.

As will become apparent below in connection with FIGS. 10–11, in many applications, an extensive amount of information pertaining to the magnetic flux is not required. For example, it may be adequate to obtain information pertaining simply to whether the flux is above or below a certain value, without there being a need to determine the actual amount of flux. In these applications, the voltage Vsen can be used as indication of the flux directly (e.g., as a feedback signal), without the need for any further processing.

Figure 7:
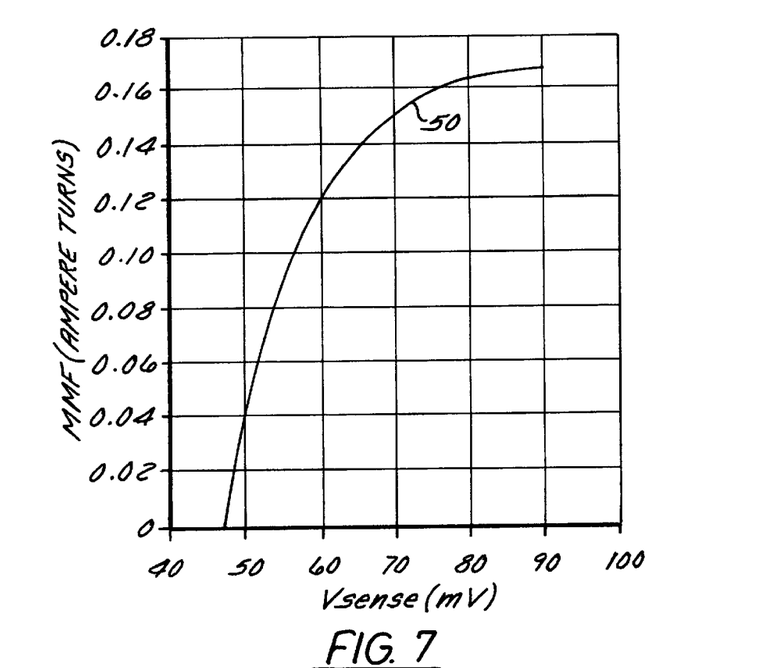
FIG. 7 is a graph of magnetic field intensity for two core materials as a function of a voltage sensed across a sense winding in the system of FIG. 1.

Referring now to FIG. 7, FIG. 7 is a graph of the magnetic field intensity in the transformer cores 20a and 20b as a function of the voltage $V_{sen}$ (curve 50). Notably, magnetic field intensity is proportional to current. Therefore, the graph of FIG. 7 can be used to convert the voltage $V_{sen}$ into a value that represents the primary current. For example, assuming the voltage $V_{sen}$ is equal to about 77 mV, then the current in the primary winding is equal to about 160 mA. Of course, if the primary current is a low frequency current, then the transformer 14 will tend toward saturation unless measures are taken to prevent saturation from occurring. The use of the voltage $V_{sen}$ as a feedback signal to prevent saturation is discussed in connection with FIGS. 10–11, below. From FIGS. 5–7, it is also apparent that the voltage $V_{sen}$ is simultaneously indicative of the magnetic flux, the magnetic flux density, and the magnetic field intensity, regardless of how the voltage $V_{sen}$ is eventually processed.

Figure 8:
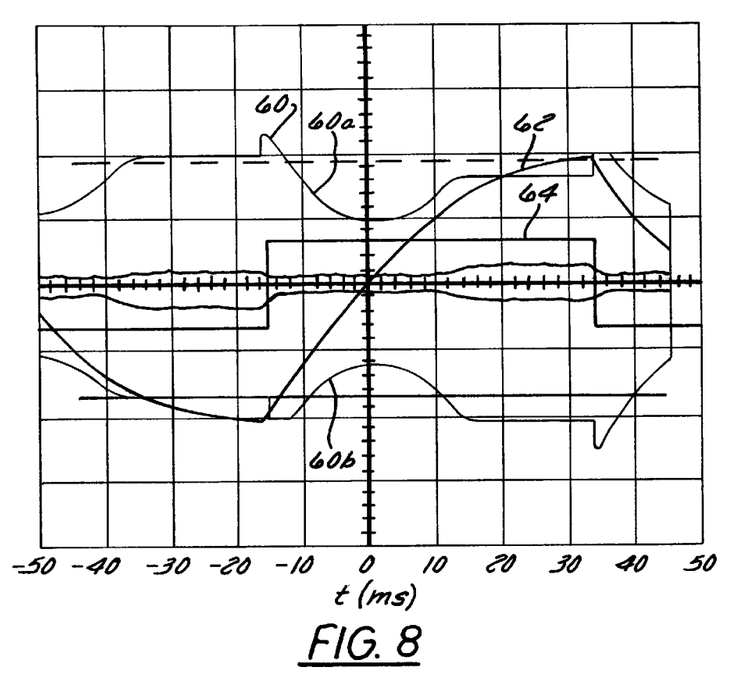
FIGS. 8 and 9 are graphs showing the operation of the system of FIG. 1.
Figure 9:
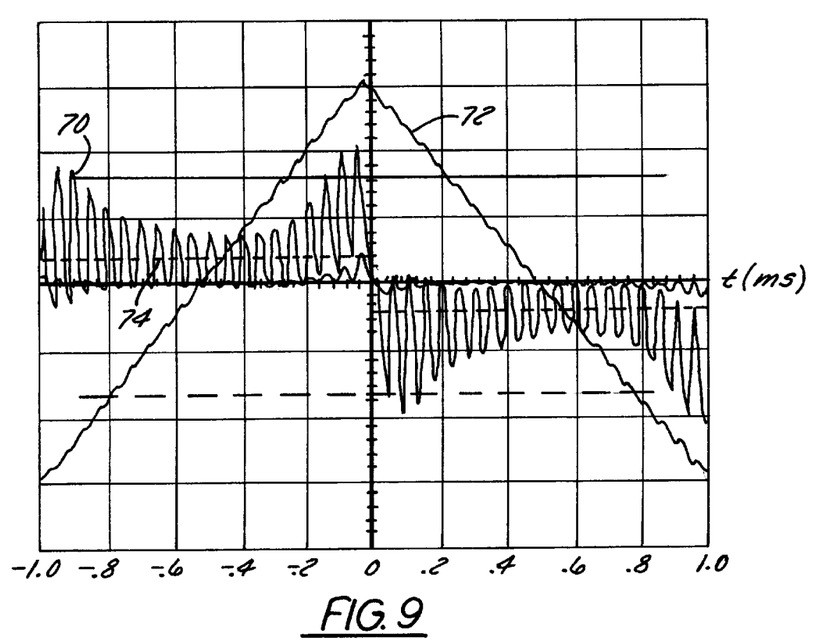

Referring now to FIGS. 8 and 9, two graphs showing the operation of the system of FIG. 1 under different operating conditions are shown. In FIG. 8, a 10 Hz square wave excitation is applied to the primary winding 26 and, in FIG. 9, a 500 Hz square winding excitation is instead applied.

In FIG. 8, curve 60 is the envelope of the voltage measured across the sense winding 22. Thus, curve 60a shows the variation of the maximum peaks with respect to time and curve 60b shows the variation of the minimum peaks with respect to time. (Due to the time scale of FIG. 8, which shows a 100 ms interval, it is not possible to show individual cycles of the voltage $V_{sen}$, which is a 20 kHz signal.) At any given instant, the voltage $V_{sen}$ (which, as previously noted, is a peak-to-peak voltage) is the difference between the curve 60a and the curve 60b. The curve 62 is the magnetic flux in the transformer cores 20a and 20b with respect to time. The curve 64 is the 10 Hz square wave voltage excitation signal applied to the primary winding 26. In FIG. 8, one full cycle of the 10 Hz excitation signal is shown.

Beginning at t=0 (in the middle of the graph), it is seen that the magnetic flux Φ is equal to zero. However, due to the positive voltage applied to the primary winding 26, the magnetic flux Φ is increasing. At the same time, the voltage $V_{sen}$ is at a minimum value (corresponding to the magnetic flux being equal to zero), but is increasing (corresponding to the increasing magnetic flux).

At about 13 ms, the transformer cores 20a and 20b begin to saturate, and therefore the voltage $V_{sen}$ is no longer a reliable indication of the magnetic flux Φ. In this regard, it may be noted that conventional current transformers and Hall-based current sensing devices similarly no longer produce reliable data once saturation occurs, because the equations that govern "normal operation" of these devices break down in saturation. As will be discussed below, a particular advantage of the system of FIG. 1 is that it detects magnetic flux, which in turn allows the level of magnetic flux to be controlled to prevent saturation.

At about t=35 ms, the 10 Hz square wave excitation changes state such that a negative voltage is now applied to the primary winding 26. Due to the negative voltage, the magnetic flux begins to decrease and, at about t=39 ms, the transformer cores 20a and 20b drop out of saturation. Once this occurs, the voltage $V_{sen}$ again provides an indication of the magnetic flux of the cores 20a and 20b. The voltage $V_{sen}$ continues to decrease as a negative voltage is applied to the primary winding 26 and the magnetic flux continues to decrease.

The graph in FIG. 8 ends at t=50 ms, however, it can be seen from the interval during t=50 ms to t=0 that the system operates as expected. Given that the signal at the primary winding 26 is cyclical, the operation of the system during the interval t=−50 ms to t=0 is the same as during the interval t=50 ms to t=100 ms. During these intervals, the voltage $V_{sen}$ continues to decrease as the negative voltage represented by the curve 64 continues to be applied to the primary winding 26 and the magnetic flux in the transformer cores 20a and 20b continues to decrease.

The transformer cores 20a and 20b are in saturation from t=−38 ms to t=−13 ms. When the transformer cores 20a and 20b come out of saturation, the voltage $V_{sen}$ is at a maximum value and subsequently decreases as the magnetic flux decreases towards zero.

It may therefore be noted that the voltage $V_{sen}$ provides an "absolute value" indication of the magnetic flux. In other words, the voltage $V_{sen}$ is at a positive maximum both when the magnetic flux is at a positive maximum and when the magnetic flux is at a negative maximum, and the voltage $V_{sen}$ is at a positive minimum when the magnetic flux density is equal to zero (the voltage $V_{sen}$ does not assume negative values). Thus the voltage $V_{sen}$ does not indicate the polarity of the magnetic flux density. However, an approach is described below for determining the polarity of the magnetic flux in situations where it is desirable to know the polarity.

In FIG. 9, a 500 Hz square wave excitation is applied to the primary winding 26. The curve 70 is the voltage across the sense winding 22 with respect to time. Because FIG. 9 has a different time scale than FIG. 8 (only 2 ms of data is shown in FIG. 9 as compared to 200 ms in FIG. 8), individual cycles of the voltage $V_{sen}$ are shown in FIG. 9. The voltage $V_{sen}$ is the peak-to-peak voltage of the curve 70, the curve 72 is the magnetic flux with respect to time, and the curve 74 is the 500 Hz square wave voltage excitation signal applied to the primary winding 26.

From t=−2.0 ms to t=−1.0 ms (not shown) a negative voltage is applied to the primary winding 26. Accordingly, at t=−1.0 ms, the magnetic flux in the cores 20a and 20b is at a negative maximum, and the voltage $V_{sen}$ is at a maximum value. Thereafter, the voltage applied to the primary winding 26 becomes positive, and the magnetic flux begins to increase towards zero. At the same time, the voltage $V_{sen}$ begins to decrease, and continues to decrease until the magnetic flux passes through zero at the t=−0.5 ms, at which time the voltage $V_{sen}$ begins to increase.

At t=0, the 500 Hz square wave excitation changes state such that a negative voltage is now applied to the primary winding 26. As a result, the magnetic flux decreases, and the voltage $V_{sen}$ decreases and then increases after the magnetic flux passes through zero, as expected.

In FIG. 9, a number of additional features can be seen as a result of the different time scale as compared to FIG. 8. First, ripples can be seen in the curve 72 that represents the magnetic flux. These ripples are caused by the 20 kHz square wave excitation applied to the excitation winding 24. In other words, the positive voltage pulses applied to the excitation winding 24 cause slight increases in the magnetic flux Φ which cancel the slight decreases caused by the negative voltage pulses (i.e., assuming the 20 kHz excitation signal is centered about zero).

It may be noted, however, that the shape of the pulses will be asymmetric depending on whether the flux in the cores 20a and 20b is positive or negative. In other words, for example, the positive flux excursions will be different depending on whether the flux in the core is positive or negative, because in one situation the core is moving towards saturation (and permeability is decreasing), and in the other situation the core is moving away from saturation (and permeability is increasing). By examining these flux excursions, an indication of the polarity of the flux may be obtained. It may also be that using a lower frequency square wave excitation signal and/or a larger amplitude excitation will increase the size of the flux excursions and therefore make the asymmetry more pronounced. Nevertheless, it is desirable to have the flux excursions as small as possible while still allowing the polarity to be determined, in order to minimize the effect of the excitation signal applied at the winding 24 on the overall amount of flux in the transformer 14.

Additionally, in FIG. 9, it is seen that the average value of the curve 70 changes as a function of the state of the 500 Hz square wave excitation. This effect is also present in FIG. 1 although it is not as noticeable. This effect is caused by the fact that the 500 Hz square wave excitation causes a change in flux with respect to time that is detectable by the sense winding 22. The change in flux caused by the 500 Hz square wave excitation manifests itself as a voltage that is added to or subtracted from the higher frequency voltage oscillation (the peak-to-peak value of which is measured to determine flux) caused by the 20 kHz square wave excitation applied to the excitation winding 24.

The practical consequence of this latter feature is that the frequency difference between the highest anticipated frequency of the signal applied to the primary winding 26 and the frequency of the excitation signal applied to the excitation winding 24 should be sufficiently large to permit the portion of the output of the sense winding 22 attributable to the signal applied to the primary winding 26 and the portion of the output attributable to the signal applied to the excitation winding 24 to be distinguished.

Figure 10:
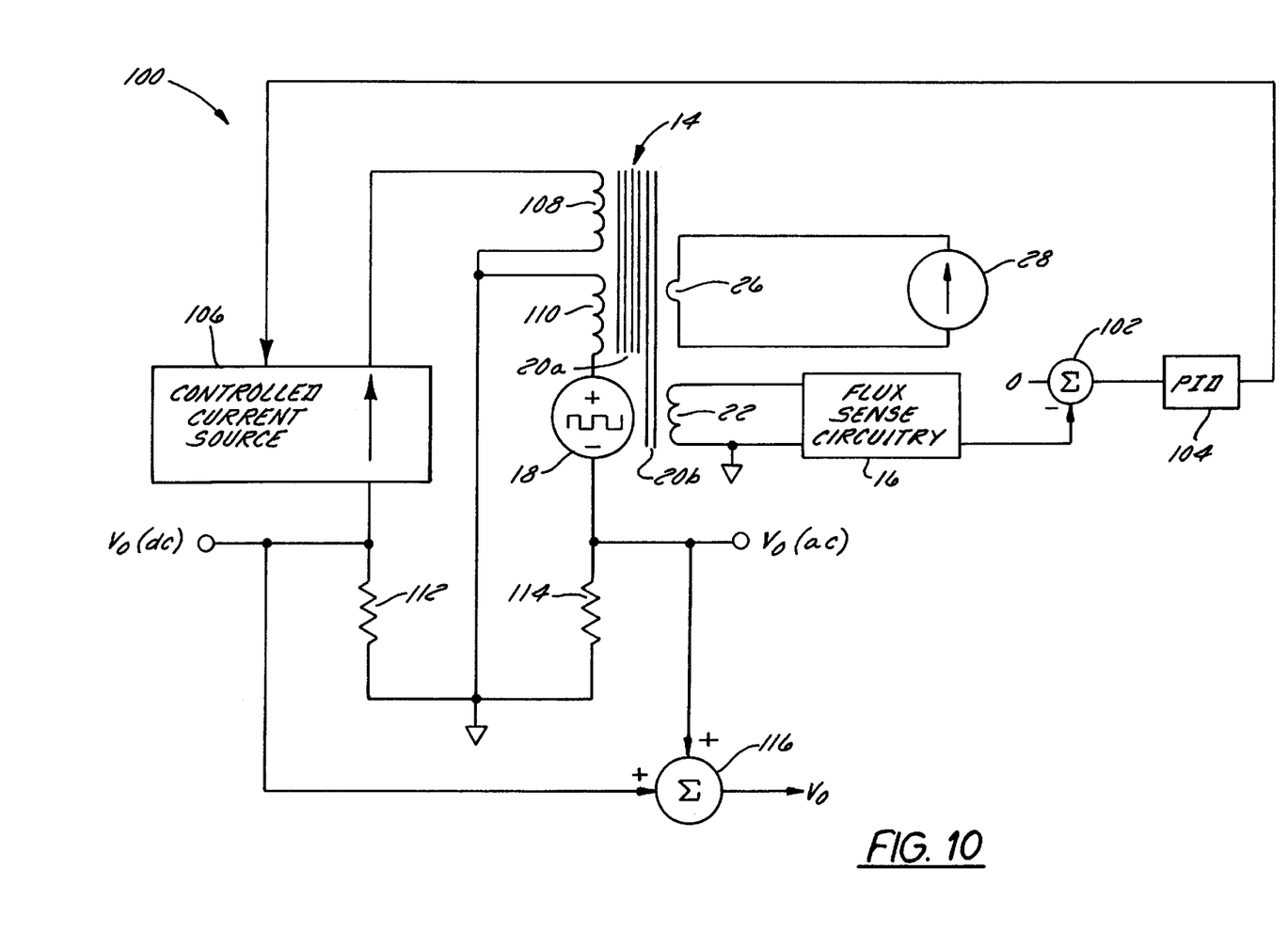
FIG. 10 is a current sensor in accordance with a second preferred embodiment of the invention.

Referring now to FIG. 10, a preferred current sensing system 100 is illustrated. The system 100 of FIG. 10 is the same as the system 10 of FIG. 1, except that in FIG. 10, a summing element 102, a PID (proportional-integral-derivative) gain element 104, a controlled current source 106, a flux cancellation winding 108 and an excitation winding 110, burden resistors 112 and 114, and a summing element 116 are also utilized. These additional elements are used to implement a feedback control loop to control the flux in the cores 20a and 20b, and to measure the current through the primary winding 26. In practice, the flux sense circuitry 16, the summing element 102 and the PID gain element 104 may be implemented using analog circuit elements or using digital circuit elements, for example, an A/D converter (to measure the voltage $V_{sen}$), a microprocessor coupled to a memory (to linearize and scale the output from the A/D converter, and to implement the summing element 102 and the PID gain element 104), and a D/A converter (to provide an analog output to the controlled current source 106). The summing element 116 may be implemented using, for example, analog op-amp circuitry or additional digital circuitry.

The system operates in the following manner. When a current flows in the primary winding 26, the current induces a magnetic flux which is detectable by the flux sense circuitry 16 in the manner previously described in connection with FIG. 1. The flux sense circuitry 16 preferably provides an output which is a linearized version of the voltage $V_{sen}$, and provides an output with a value equal to zero when the magnetic flux is equal to zero. This can be achieved through the use of a look-up table, for example.

The output of the flux sense circuitry 16 is provided as feedback to the summing element 102. The summing element 102 also accepts a setpoint input. In FIG. 10, the setpoint is set equal to zero, although it would also be possible to use a different (non-zero) setpoint. This may done, for example, if is desired to maintain the flux at some other, non-zero level.

The output of the summing element 102 is a flux error signal which is applied to the PID gain element 104, which performs PID compensation. Although a PID control loop is shown, other control loops could also be utilized (e.g., a PI control loop or a hystersis control loop). The compensated error signal from the PID gain element 104 is provided as a control input to the controlled current source 106. Thus, the current source 106 is controlled so as to maintain zero magnetic flux in the transformer cores 20a and 20b. To the extent that there is non-zero flux, this is detected as an error by the flux sense circuitry 116 and the summing element 102, and the PID gain element 104 performs compensation to eliminate the error (i.e., drive the flux to zero).

Advantageously, the system 10 not only takes prevents low frequency current components in the primary winding 26 from saturating the transformer 14, but also makes it possible to measure those low frequency components. The primary current, including both the low frequency and high frequency current components, is measured in the following manner.

With respect to the low frequency components of the primary current, the burden resistor 112 is provided which produces a voltage $V_{0(dc)}$ that is indicative of the low frequency current components. The current flowing through the burden resistor 112 is a mirror image of the low frequency current flowing through the primary winding 26. This is because the flux sense circuitry 16 utilizes a high impedance voltage measuring device, so no significant current flows through the sense winding 22 and therefore the sense winding 22 does not affect the flux in the transformer cores. Additionally, the current that flows in the winding 110 does not have any low frequency components. Therefore, in order for the flux produced by the current flowing in the winding 108 to cancel the flux produced by the primary current, the current flowing in the winding 108 must be a mirror image of the primary current (related by the turns ratio of the windings 108 and 26). As a result, the low frequency components of the primary current can be measured by measuring the voltage $V_{0(dc)}$ across the burden resistor 112.

With respect to the high frequency components of the primary current, the burden resistor 114 is provided which produces a voltage $V_{0(dc)}$ that is indicative of the high frequency current components. For high frequency components of the primary current, the primary winding 26 and the winding 110 behave as a conventional current transformer. The high frequency components of the primary current induce a secondary current in the winding 110, thereby producing the voltage $V_{0(dc)}$, which is indicative of the high frequency current components. The winding 110 acts as an inductor to filter out the 20 kHz excitation signal in the measured voltage $V_{0(dc)}$.

Thus, in combination, the high frequency and low frequency components of the system 110 cooperate in the following manner. The flow of primary current in the primary winding 26 induces a magnetic flux that flows in the transformer 14. The natural inclination is for the magnetic flux to induce a secondary current in the winding 110. To the extent that this occurs, the flow of secondary current in the winding 110 produces a counterflux that approximately cancels the flux produced by the primary current. The cancellation of the flux produced by the primary current is not total due to non-zero winding resistance. However, to the extent that high frequency components of the flux are not immediately canceled, due to the non-zero winding resistance, the high frequency components are eventually canceled by virtue of the fact that the primary current is cyclical and therefore the remaining flux is canceled during the next half-cycle.

For conventional current transformers, it is when the frequency is too low, and therefore magnetic flux is allowed to build up for too long before being canceled during the next half cycle, that saturation problems are encountered. In the current sensing system 100 of FIG. 10, this magnetic flux is instead canceled by the current that flows through the winding 108. This current is produced by the controlled current source 106 in response to a control signal from the PID gain element 104. The current required to cancel the remaining flux is measurable by measuring the voltage $V_{0(dc)}$ across the burden resistor 112. The voltages $V_{0(dc)}$ and $V_{0(dc)}$ produced across the burden resistors 112 and 114 can then be directly added by a summing element 116 to produce an overall indication of the primary current.

It may be noted that, in the current sensing system of FIG. 10, there is no particular need to store information that relates to $\mu_1(H)$, $\mu_2(H)$, $\mu_1(B)$, $\mu_2(B)$. The voltage $V_{sen}$ provides an indication of the magnetic flux in the transformer cores (i.e., by increasing as the flux error increases), but there is no need to determine the actual amount of flux in the transformer cores 20a and 20b. Thus, this further simplifies implementation of the system of FIG. 10.

Figure 11:
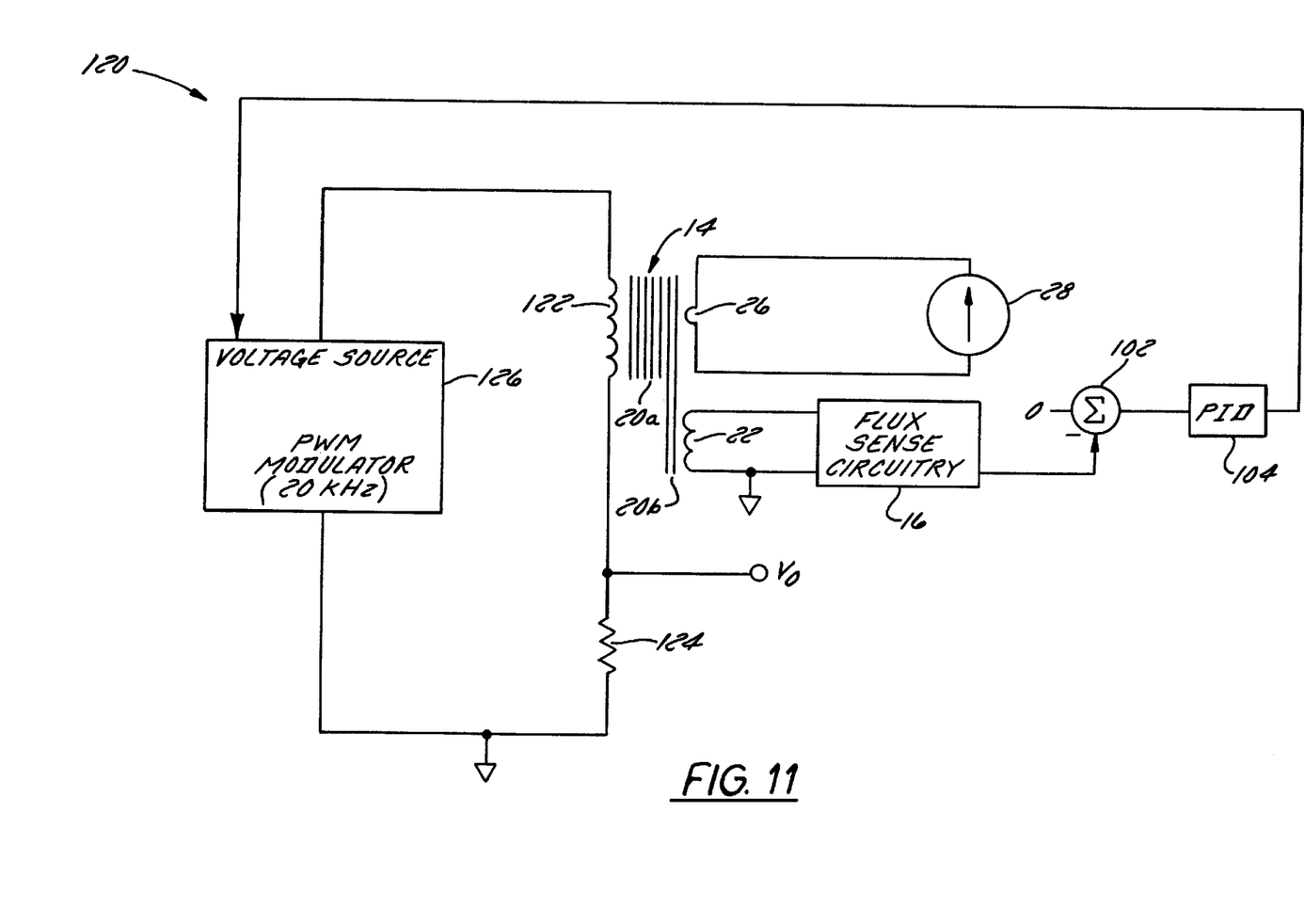
FIG. 11 is another current sensor in accordance with a third preferred embodiment of the invention.

Referring now to FIG. 11, another embodiment of a current sensing system 120 is illustrated. The embodiment of FIG. 11 is preferred over the embodiment of FIG. 10, because it is simpler. In particular, in FIG. 11, 20 kHz square wave excitation source 18 and the current source 106 have been replaced with a single PWM voltage source 126, the windings 108 and 110 have been replaced by a single winding 122, the burden resistors 112 and 114 have been replaced by a single burden resistor 124.

The voltage source 126 produces a 20 kHz PWM signal which operates in the same manner as the signal from the 20 kHz square wave excitation source 18 in FIGS. 1 and 10, In this case, however, the control signal from the PID gain element 104 controls the pulse widths of the signal from the source 126 to provide the signal with the DC component required to cancel any flux in the transformer 14.

The current flowing through the winding 122 is then a mirror image of the primary current, and is related to the primary current by the turns ratio of the winding 122 to the primary winding 26. The flux induced by the primary current is canceled partially by the induced counterflux from the high frequency components of the current in the winding 122 (the high frequency components of the current in winding 122 being produced in direct response to the primary current via the magnetic coupling of the transformer 14), and partially by the flux induced by the low frequency components of the current in the winding 122 (the low frequency components of the current in winding 122 being produced by the source 26 in response to the control signal from the PID gain element 104). The mid-frequency components of the flux are canceled by a combination of these actions. The net effect is that all of the magnetic flux in the transformer 14 is canceled, and the voltage $V_O$ produced across the burden resistor 124 which is indicative of all frequency components of the primary current.

From the foregoing discussion, a number of advantages of a sensing system and method in accordance with the preferred aspects of the invention should be apparent. First, the system sensor is able to sense magnetic flux in static conditions, that is, when the change in flux with respect to time is equal to zero. Thus, unlike conventional current transformers, the system is able to sense and respond to low frequency magnetic flux components.

Additionally, the preferred system is simple in construction. The preferred sensor comprises two magnetic structures or paths formed of materials with different magnetic characteristics, and a plurality of windings. For many applications, such as current sensing, processing can be performed using exclusively analog circuitry, if desired.

Moreover, the preferred flux sensor exhibits superior sensitivity and accuracy characteristics as compared to a Hall-effect sensor. Because no gap is introduced into the magnetic path through which magnetic flux flows, the path retains superior permeability characteristics. Therefore, sensitivity and accuracy remain high.

For a current sensor in accordance with the preferred aspects of the invention, the current sensor operates as a current transformer for high frequency components of the primary current, and therefore retains the favorable sensitivity and accuracy characteristics of conventional current transformers. However, the current sensor is also able to detect low frequency components of the primary current, cancel the flux produced thereby to keep the transformer out of saturation, and generate information that is indicative of the low frequency current components. Thus, the current sensor enjoys the advantages of conventional current transformers in terms of precision and accuracy, but does not suffer the limitations of conventional current transformers (namely, the inability of conventional current transformers to operate in the presence of a primary current with low frequency components).

Many other changes and modifications may be made to the present invention without departing from the spirit thereof. The scope of these and other changes will become apparent from the appended claims.

I claim:

1. A method of sensing a parameter comprising:
   (A) providing a first material that is characterized by a first permeability function;
   (B) providing a second material that is characterized by a second permeability function, the second permeability function being different than the first permeability function; and
   (C) acquiring information indicative of permeability of the first material relative to the second material, the permeability of the first material relative to the second material being indicative of the parameter.

2. A method according to claim 1, wherein the first permeability function describes the permeability of the first material as a function of either magnetic flux density or magnetic field intensity in the first material, and the second permeability function describes the permeability of the second material as a function of either magnetic flux density or magnetic field intensity in the second material.

3. A method according to claim 1, wherein the parameter sensed is current in a primary winding that is wound around a first transformer core formed by the first material and around a second transformer core formed by the second material.

4. A method according to claim 1, further comprising providing an excitation signal to an excitation winding that tends to cancel a low frequency component of a magnetic flux in the first and second materials.

5. A method according to claim 1, wherein the acquiring step comprises applying an excitation signal to an excitation winding, the excitation winding being wound around the second material;
measuring a sense signal produced at a sense winding, the sense winding being wound around the second material, the sense signal being produced in response to the excitation signal, and the sense signal having a characteristic that is indicative of the permeability of the first material relative to the second material.

6. A method according to claim 5, wherein the excitation signal is a first excitation signal, and further comprising exciting the excitation winding with a second excitation signal, the second excitation signal tending to cancel a low frequency component of a magnetic flux in the first and second materials.

7. A method according to claim 6, wherein the step of exciting the excitation winding with the second excitation signal comprises implementing a feedback control loop which uses as feedback the sense signal from the sense winding, and wherein the second excitation signal is controlled by the feedback control loop.

8. A method according to claim 5, wherein the parameter is a parameter relating to an amount of a total amount of magnetic flux flowing through the first and second materials, and wherein the acquiring step further comprises accessing a look-up table to convert a parameter pertaining to the sense signal to the parameter relating to the amount of the total amount of magnetic flux flowing through the first and second materials.

9. A method according to claim 6, wherein the parameter is current, and wherein the acquiring step further comprises sensing the current by sensing the second excitation signal.

10. A method according to claim 6, wherein the first excitation signal is at a frequency that is substantially higher than a frequency of the second excitation signal.

11. A method according to claim 10, wherein the second excitation signal has a frequency component that is less than 20 Hz.

12. A method according to claim 1, wherein the first permeability function varies with respect to the second permeability function by an amount that is dependent on the amount of magnetic flux carried by the first and second materials.

13. A method according to claim 1, wherein the first material forms a core, wherein a winding is wound around the core, and wherein the parameter pertains to a current flowing through the winding.

14. A method according to claim 1,
wherein the first material forms at least a portion of a first magnetic path;
wherein the second material forms at least a portion of a second magnetic path;
wherein magnetic flux flows through the first and second magnetic paths during the acquiring step; and
wherein a ratio of (1) an amount of the magnetic flux which flows through the first magnetic path to (2) an amount of the magnetic flux which flows through the second magnetic path varies as a function of a total amount of the magnetic flux flowing through the first and second magnetic paths.

15. A method according to claim 14, wherein the information indicative of the permeability of the first material relative to the second material is acquired by acquiring information indicative of the ratio.

16. A method according to claim 14, wherein a reluctance of the first magnetic path varies with respect to a reluctance of the second magnetic path by an amount that is dependent on a total amount of magnetic flux carried by the first and second paths.

17. A method according to claim 1, wherein the acquiring step is performed using a first winding that is wound around both the first material and the second material and a second winding that is wound around only one of the first material and the second material.

18. A method according to claim 17, wherein the acquiring step is performed using the first winding to apply an excitation signal to the first and second materials and using the second winding to receive a sense signal from the only one of the first and second materials.

19. A sensor comprising:
(A) a first structure formed of a first magnetically conductive material, the first material having a first permeability that varies in accordance with an amount of magnetic flux passing through the first material;
(B) a second structure formed of a second magnetically conductive material, the second material having a second permeability that varies in accordance with an amount of magnetic flux passing through the second material;
(C) an excitation winding, the excitation winding being wound around the second structure;
(D) an excitation source, the excitation source applying an excitation signal to the excitation winding; and
(E) a sense winding, the sense winding being wound around the second structure, the sense winding producing a sense signal in response to the excitation signal applied to the excitation winding, and the sense signal being indicative of the permeability of the first material relative to the permeability of the second material.

20. A sensor according to claim 19, wherein the sensor is a current sensor, wherein the first structure is a first transformer core and the second structure is a second transformer core, wherein the sensor further comprises a primary winding that is wound around the first and second transformer cores and that receives a primary current that is measured by the sensor.

21. A sensor according to claim 20, wherein the excitation signal is a first excitation signal, wherein the sensor further comprises a feedback control circuit, the feedback control circuit utilizing the sense signal as feedback, and the feedback control circuit generating a control signal that controls a second excitation signal that is applied to at least one of the first and second transformer cores and that tends to prevent the at least one transformer core from being saturated.

22. A sensor according to claim 21, wherein the excitation source is a pulse width modulated excitation source, the pulse width modulated excitation source producing both first and second excitation signals and applying both the first and second excitation signals simultaneously to the excitation winding.

23. A sensor according to claim 21, wherein the second excitation signal provides an indication of a low frequency component of a current through the sensor.

24. A sensor according to claim 19, wherein the first permeability varies with respect to the second permeability by an amount that is dependent on the amount of magnetic flux carried by the first and second materials.

25. A sensor according to claim 19, wherein the first structure forms at least a portion of a first magnetic path;

wherein the second structure forms at least a portion of a second magnetic path;

wherein a reluctance of the first magnetic path varies with respect to a reluctance of the second magnetic path by an amount that is dependent on a total amount of magnetic flux carried by the first and second paths.

26. A sensor according to claim 19, wherein the excitation winding is wound around both the first and second structures, and the sense winding is wound only around the second structure.

27. A sensor comprising:

(A) a magnetic flux divider, the magnetic flux divider comprising first and second magnetic paths through which magnetic flux flows, and the magnetic flux divider dividing the magnetic flux between the first and second magnetic paths as a function of a total amount of magnetic flux flowing through the magnetic flux divider;

(B) a winding, the winding producing a signal that is indicative of the permeability of the first magnetic path relative to the second magnetic path.

28. A sensor according to claim 27, wherein the sensor is a current sensor, wherein the first magnetic path comprises a first transformer core and the second magnetic path comprises a second transformer core, wherein the winding is a sense winding, and wherein the sensor further comprises a primary winding that is wound around the first and second transformer cores and that receives a primary current that is measured by the sensor.

29. A sensor according to claim 28, wherein the sensor further comprises a feedback control circuit, the feedback control circuit utilizing as feedback the signal produced by the sense winding, and the feedback control circuit generating a control signal that controls an excitation signal that is applied to at least one of the first and second transformer cores and that tends to prevent the at least one transformer core from being saturated.

30. A sensor according to claim 27, wherein a reluctance of the first magnetic path varies with respect to a reluctance of the second magnetic path by an amount that is dependent on a total amount of magnetic flux carried by the first and second magnetic paths.

31. A sensor according to claim 27, wherein the winding is a first winding, wherein the sensor comprises a second winding, wherein one of the first and second windings is wound around both the first and second magnetic paths and the other of the first and second windings is wound around only one of the first and second magnetic paths.

32. A sensor according to claim 31, wherein the first winding is wound around only one of the first and second magnetic paths and the second winding is wound around both the first and second magnetic paths.

33. A method of sensing current comprising:

(A) acquiring information pertaining to a permeability of a first material relative to a permeability of a second material, the first material forming a first core and the second material forming a second core, the current flowing through a winding that is wound around the first and second cores, and the information pertaining to the permeability of the first material relative to the permeability of the second material providing an indication of a total amount of magnetic flux flowing through the first and second cores;

(B) generating a flux error signal, the flux error signal being indicative of the total amount of magnetic flux relative to a commanded amount of magnetic flux;

(C) generating an excitation signal in response to the flux error signal, the excitation signal tending to cause the total amount of magnetic flux to be adjusted so as to minimize the flux error signal; and (D) sensing the current by sensing the excitation signal.

34. A method according to claim 33, wherein the acquiring step is performed using a first winding that is wound around both the first material and the second material and a second winding that is wound around only one of the first material and the second material.

\* \* \* \* \*